(12) United States Patent
Liang et al.

(10) Patent No.: US 6,653,235 B2
(45) Date of Patent: Nov. 25, 2003

(54) FABRICATING PROCESS FOR FORMING MULTI-LAYERED METAL BUMPS BY ELECTROLESS PLATING

(75) Inventors: Muh-Wang Liang, MiaoLi (TW); Yi-Hsiu Tseng, TaiChung (TW); Pang-Min Chiang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/887,074

(22) Filed: Jun. 25, 2001

(65) Prior Publication Data

US 2002/0173073 A1 Nov. 21, 2002

(30) Foreign Application Priority Data

May 16, 2001 (TW) ........................................ 90111669 A

(51) Int. Cl.$^7$ .............................................. H01L 21/00
(52) U.S. Cl. ...................................................... 438/687
(58) Field of Search ................................ 438/627, 687, 438/688

(56) References Cited

U.S. PATENT DOCUMENTS 5,172,473 A * 12/1992 Burns et al. .................. 29/885
6,346,472 B1 * 2/2002 Lopatin et al. ............. 438/627

* cited by examiner

Primary Examiner—W. David Coleman
(74) Attorney, Agent, or Firm—Troxell Law Office PLLC

(57) ABSTRACT

The present invention provides a fabricating process for forming multi-layered metal bumps by electroless plating, comprising the steps of: providing an IC chip or a semiconductor substrate on which there are provided a plurality of pads; dispensing a first dielectric layer, exposing the pads, roughing the surface to be redistributed by chemical or physical approaches, activating the surface in order to follow-up electroless plating deposition advantageously, and dispensing a second dielectric layer so as to define a redistribution path; depositing a conductive film on the redistribution path by electroless plating, in which the conductive film allows the positions of the pads to be changed so as to be connected to the external circuit; forming a photoresist pattern, exposing a plurality of pre-determined positions on the conductive film so as to redistribute the positions for the metal bumps formed later; performing activation on the pre-determined positions so as to generate an activator; forming initial metal bumps of a pre-determined thickness on the pads by electroless plating; removing the photoresist pattern, completely exposing the metal bumps; dispensing a third dielectric layer, having a thickness less than the height of the metal bumps and a window more than the size of the metal bumps, so as to expose the metal bumps; and forming a peripheral metal layer covering the periphery of the metal bumps, in which the conductivity and the RF characteristics of the peripheral metal layer are better than those of the metal bumps so as to be electrically connected to the conductive film.

17 Claims, 7 Drawing Sheets

FABRICATING PROCESS FOR FORMING MULTI-LAYERED METAL BUMPS BY ELECTROLESS PLATING

BACKGROUND OF THE INVENTION

1. Field of the Invention

The present invention generally relates to a fabricating process for forming multi-layered metal bumps by electroless plating, and more particularly, to a fabricating process for forming metal bumps with sufficient height and good coverage, which is applicable to the packages of LCDs, ICs, and radio frequency (RF) devices by using an an-isotropic conductive film.

2. Description of the Prior Art

In recent years, the state-of-the-art semiconductor related techniques have developed rapidly and competitively. All the leading manufacturers have made efforts in developing IC components with lower costs, smaller sizes, and higher performances. In addition to the leading technologies for 12-inch silicon wafer and deep sub-micron fabrication, the package technology has become a more important issue as well. Conventional package techniques such as lead frame package (LFP), ball grid array (BGA) package, and tape automatic bonding (TAB) package have been improved to allow IC components to have smaller sizes, higher throughput and better performances.

In the prior art, an an-isotropic conductive film is used in the packages of LCDs, ICs, and radio frequency (RF) devices. The an-isotropic conductive film has a design that a plurality of pads are located on an IC chip or a semiconductor substrate, and the pads are connected to the external circuit by using metal bumps. Therefore, different layouts can be implemented when any modification is required. To date, metal bumps are typically formed by using electroplating. However, metal bumps are individually plated. The fabrication cost increases and the throughput is limited when the plating uniformity is concerned. On the other hand, if a bump is formed on an IC chip, it should be fabricated in a wafer foundry, leading to more difficulty and complexity. In this manner, the fabrication yield is adversely affected, especially on a brittle III-V compound semiconductor wafer. Accordingly, a fabricating process has been provided by forming metal bumps on a package substrate instead of an IC chip. Conventionally, an an-isotropic conductive film is used in the packages of LCDs, ICs, and radio frequency (RF) devices by forming a Cu bump of over 20 µm in height. The growth rate of Cu film by electroless plating is about 4 µm/hr, which is not applicable when a film of such height/thickness is to be formed. Even when a thinner film is to be formed, electroless plating takes too much time and the film shows poor coverage.

Therefore, the present invention provides a simplified fabricating process for forming metal bumps that overcomes the difficulty and complexity in processing and allows batch production, which achieves the objects of high fabrication yield and low fabrication cost.

SUMMARY OF THE INVENTION

It is the primary object of the present invention to provide a low-cost fabricating process for forming multi-layered metal bumps by electroless plating, and more particularly, a fabricating process for forming metal bumps with sufficient height and good coverage, which is applicable to the packages of LCDs, ICs, and radio frequency (RF) devices by using an an-isotropic conductive film.

It is another object of the present invention to provide a fabricating process for forming multi-layered metal bumps by electroless plating, in which the metal bumps provide good electrical conductivity and RF characteristics so as to be applicable to RF device package.

In order to achieve the foregoing objects, the present invention provides a fabricating process for forming multi-layered metal bumps of Ni/Cu or Ni/Au by electroless plating, comprising the steps of:

providing an IC chip or a semiconductor substrate on which there are provided a plurality of pads;

dispensing a first dielectric layer, exposing the pads, roughing the surface to be redistributed by chemical or physical approaches, activating the surface in order to follow-up electroless plating deposition advantageously, such as Pd-activation, and dispensing a second dielectric layer so as to define a redistribution path;

depositing a conductive film on the redistribution path by electroless plating, in which the conductive film allows the positions of the pads to be changed so as to be connected to the external circuit;

forming a photoresist pattern, exposing a plurality of pre-determined positions on the conductive film so as to redistribute the positions for the metal bumps formed later;

performing activation on the pre-determined positions so as to generate an activator;

forming initial metal bumps of a pre-determined thickness on the pads by electroless plating;

removing the photoresist pattern, completely exposing the metal bumps;

dispensing a third dielectric layer, having a thickness less than the height of the metal bumps and a window more than the size of the metal bumps, so as to expose the metal bumps; and forming a peripheral metal layer covering the periphery of the metal bumps, in which the conductivity and the RF characteristics of the peripheral metal layer are better than those of the metal bumps so as to be electrically connected to the conductive film.

The present invention is characterized in that the fabricating process for forming multi-layered metal bumps by electroless plating can be applicable to RF device package by forming metal bumps having sufficient height, good coverage, good conductivity and excellent RF characteristics.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a fabricating process for forming multi-layered metal bumps by electroless plating can be exemplified by two preferred embodiments as described hereinafter.

[First Embodiment]

Figure 1A:
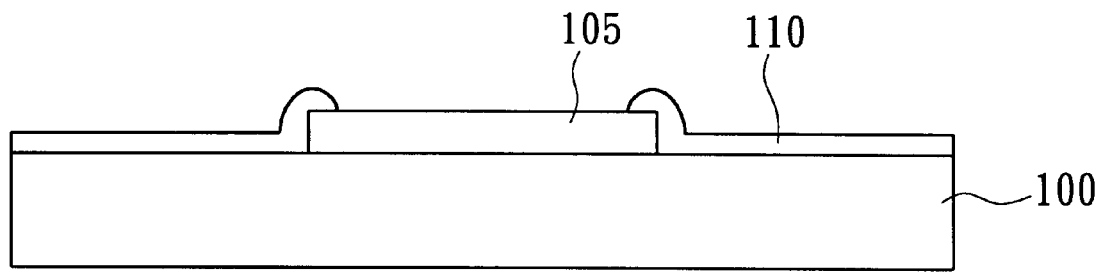
FIG. 1A to FIG. 1F are schematic diagrams showing a fabricating process for forming Ni/Cu bumps by electroless plating in accordance with the first embodiment of the present invention.

Please refer to FIG. 1A to FIG. 1F, which are schematic diagrams showing a fabricating process for forming Ni/Cu bumps by electroless plating in accordance with the first embodiment of the present invention. The fabricating process comprises:

Step 1: As shown in FIG. 1A, a semiconductor substrate 100 on which there are provided a plurality of pads 105 is provided. On the periphery of each pad 105 is deposited a passivation layer 110 so as to protect the pad 105 from being damaged. The pad 105 can be either a Cu pad or an Al pad.

Figure 1B:
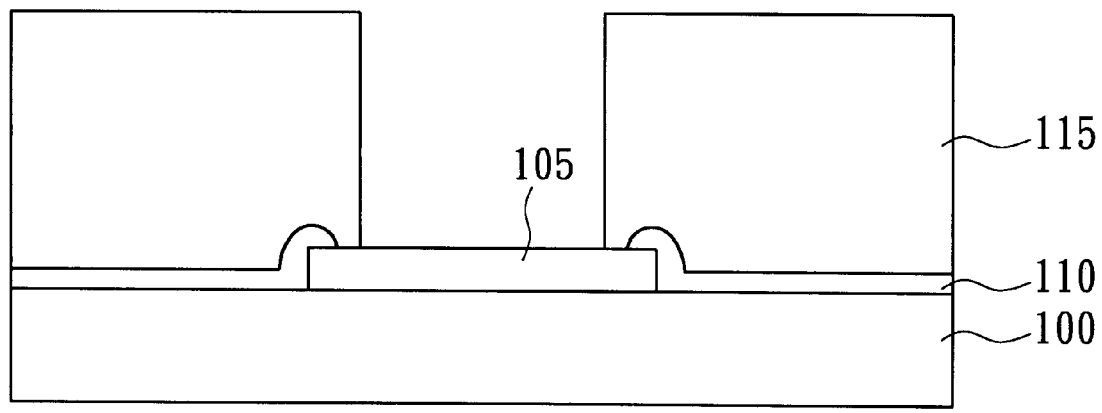

Step 2: As shown in FIG. 1B, a photoresist pattern 115 is formed to expose the pads 105. The thickness of the photoresist pattern 115 must be more than 15 $\mu$m.

Figure 1C:
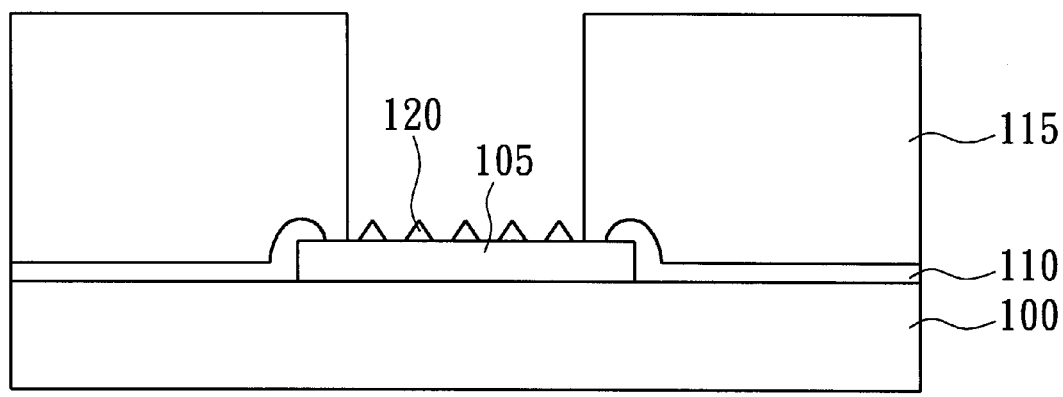

Step 3: The surfaces of the pads 105 are cleaned so as to remove contaminants and undesired oxide by using, for example, 10% $H_2SO_4$. As shown in FIG. 1C, activation is performed on the surfaces of the pads 105 so as to generate an activator 120. The activator 120 is a Pd seed for a Cu pad or a Zn seed for an Al pad.

Figure 1D:
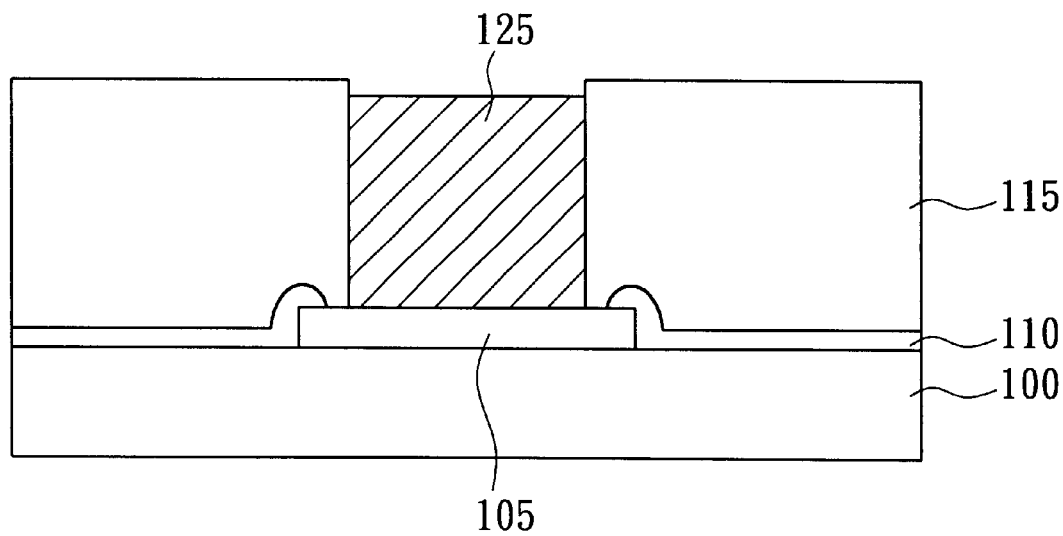

Step 4: Of importance, initial metal bumps 125 of a pre-determined thickness are formed on the pads 105 by electroless plating, as shown in FIG. 1D. It is preferable that the metal bumps are formed of Ni, which has a much higher growth rate than Cu and the thickness can be easily controlled to be 15~20 $\mu$m.

Figure 1E:
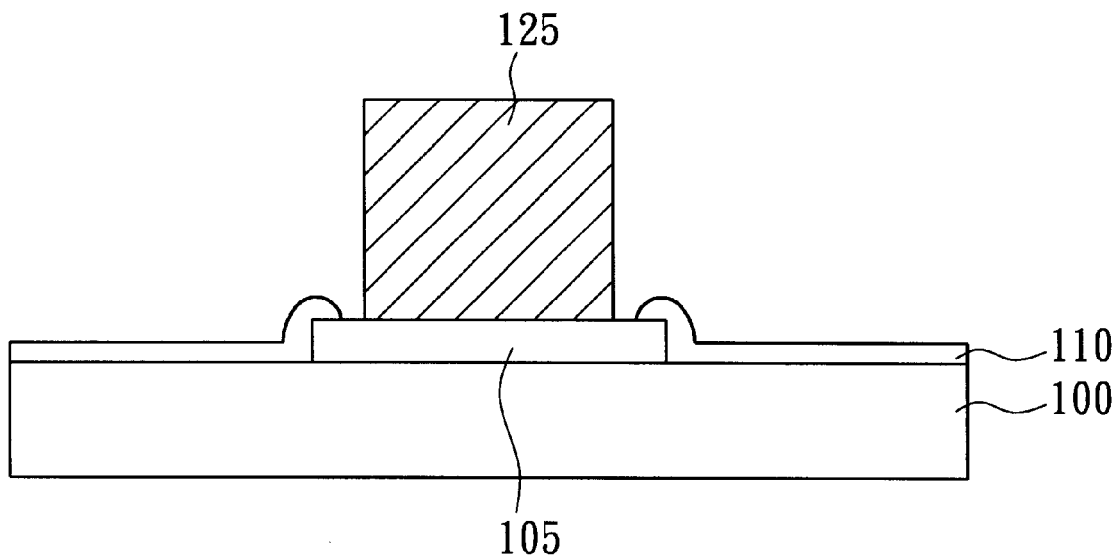

Step 5: The photoresist pattern 115 is removed so as to completely expose the metal bumps 125, as shown in FIG. 1E.

Figure 1F:
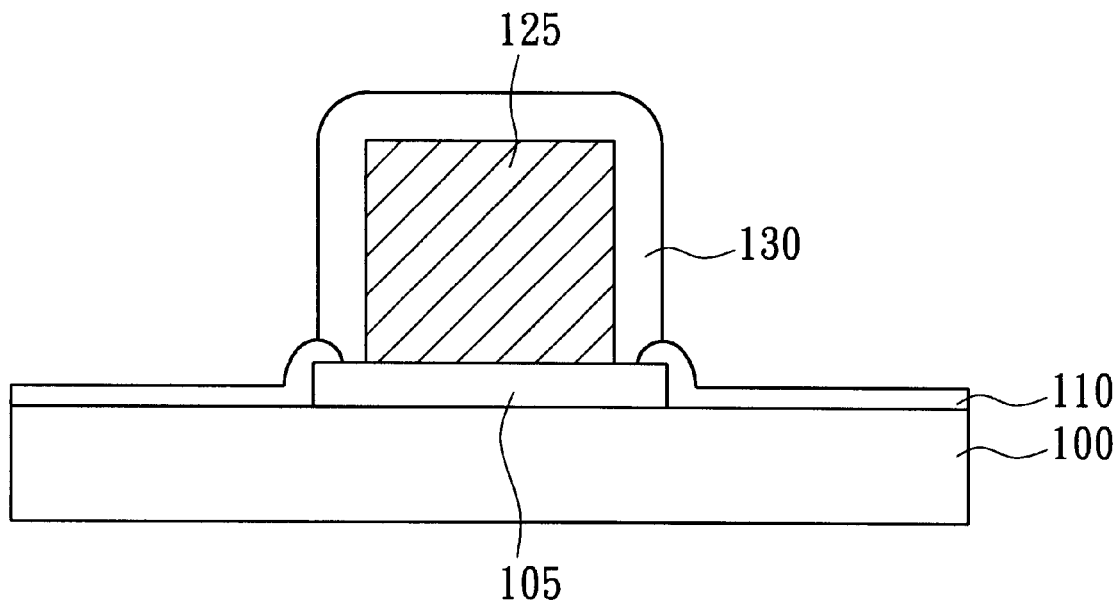

Step 6: Also of importance, a peripheral metal layer 130 is formed to cover the periphery of the metal bumps 125, as shown in FIG. 1F. It is preferable that the peripheral metal layer 130 is formed of Cu. In this manner, a pad/Ni/Cu structure is formed. The thickness of the peripheral metal layer 130 is less than 4 $\mu$m.

[Second Embodiment]

Figure 2A:
FIG. 2A to FIG. 2I are schematic diagrams showing a fabricating process for forming Ni/Cu bumps by electroless plating in accordance with the second embodiment of the present invention.

The present invention providing a fabricating process for forming Ni/Cu or Ni/Au bumps by electroless plating can also be applicable to the cases in which the positions of the pads are changed according to the layouts and the pads are connected to the external circuit when electric testing is performed. Please further refer to FIG. 2A to FIG. 2I, which are schematic diagrams showing a fabricating process for forming Ni/Cu bumps by electroless plating in accordance with the second embodiment of the present invention. The fabricating process comprises:

Step 1: As shown in FIG. 2A, an IC chip 200 on which there are provided a plurality of pads 205 is provided. The pad 205 can be either a Cu pad or an Al pad.

Figure 2B:
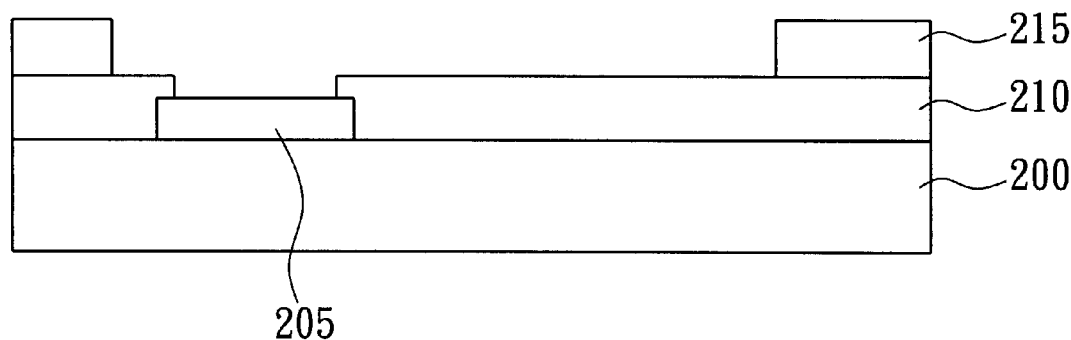

Step 2: As shown in FIG. 2B, a first dielectric layer 210 is dispensed to expose the pads 205. And then, a second dielectric layer 215 is dispensed so as to define a redistribution path. Certainly, if there is already a passivation layer covering the peripheries of the pads, the dispensing of the first dielectric layer 210 can be omitted. The surface is then roughed to be redistributed by chemical or physical approaches.

Figure 2C:
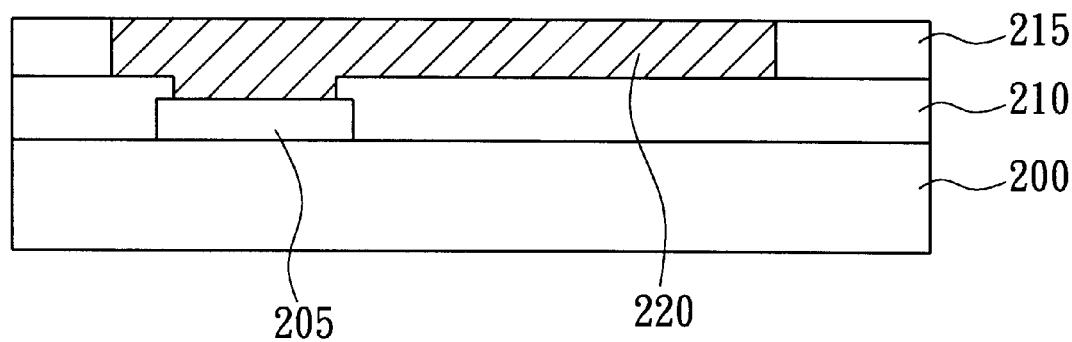

Step 3: As shown in FIG. 2C, a conductive film 220 is deposited on the redistribution path by electroless plating. It is preferable that the conductive film 220 is formed of metal, especially Cu. The conductive film 220 allows the positions of the pads to be changed so as to be connected to the external circuit. Of course, the conductive film 220 can be modified with various layouts according to individual cases.

Figure 2D:
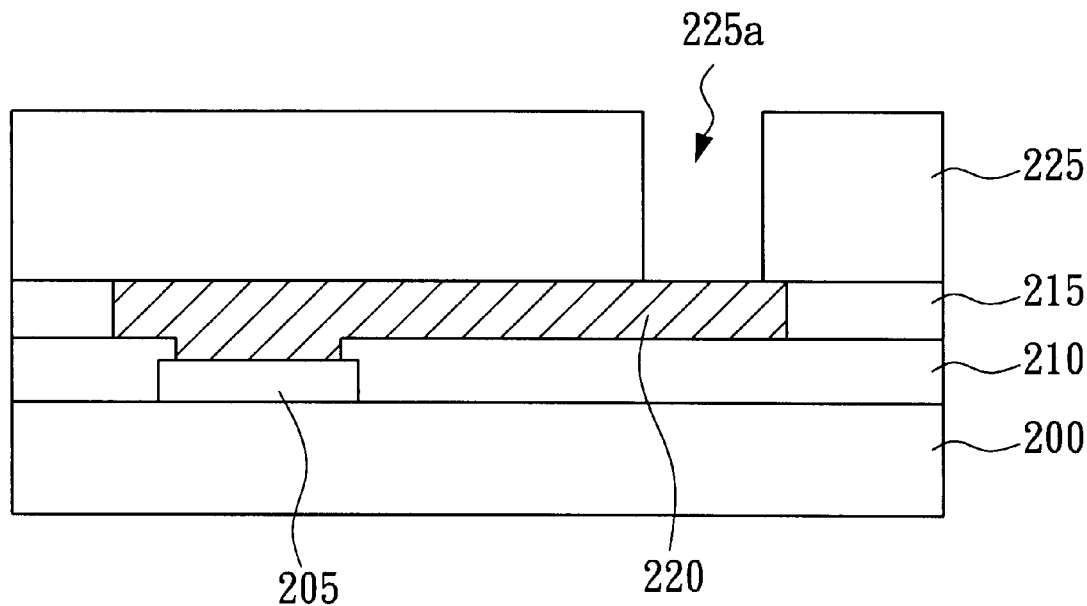

Step 4: Of importance, as shown in FIG. 2D, a photoresist pattern 225 is formed to expose a plurality of pre-determined positions 225a on the conductive film 220 so as to redistribute the positions for the metal bumps formed later. Similarly, various modifications can be made according to individual requirements.

Figure 2E:
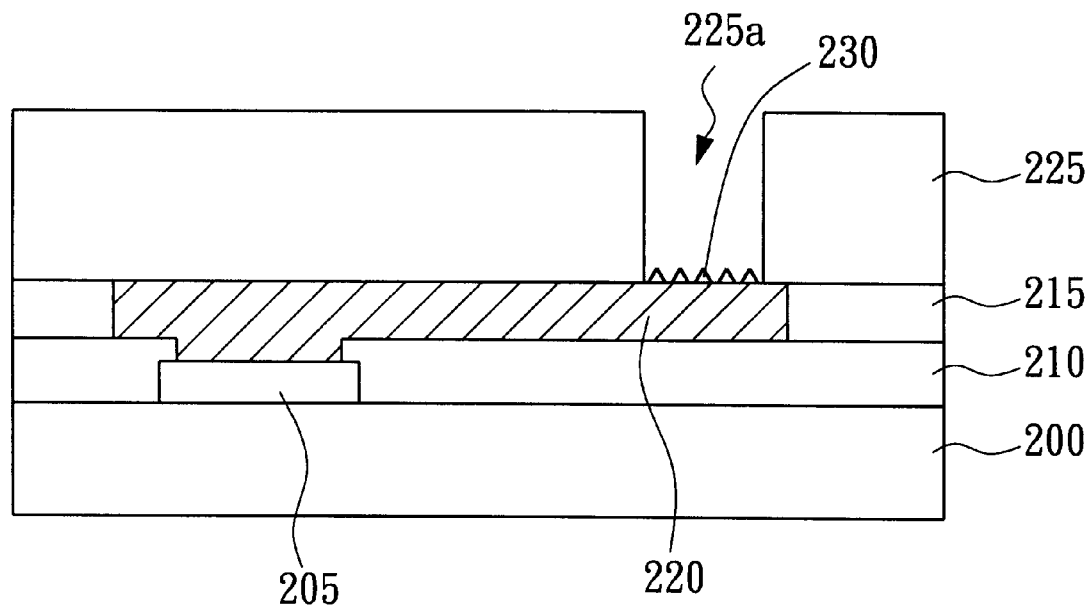

Step 5: The plurality of pre-determined positions 225a on the conductive film 220 are performed with surface cleaning so as to remove contaminants and undesired oxide by using, for example, 10% $H_2SO_4$. As shown in FIG. 2E, activation is then performed on the surfaces 225a of the pads 205 so as to generate an activator 230. The activator 230 is a Pd seed for a Cu pad or a Zn seed for an Al pad.

Figure 2F:
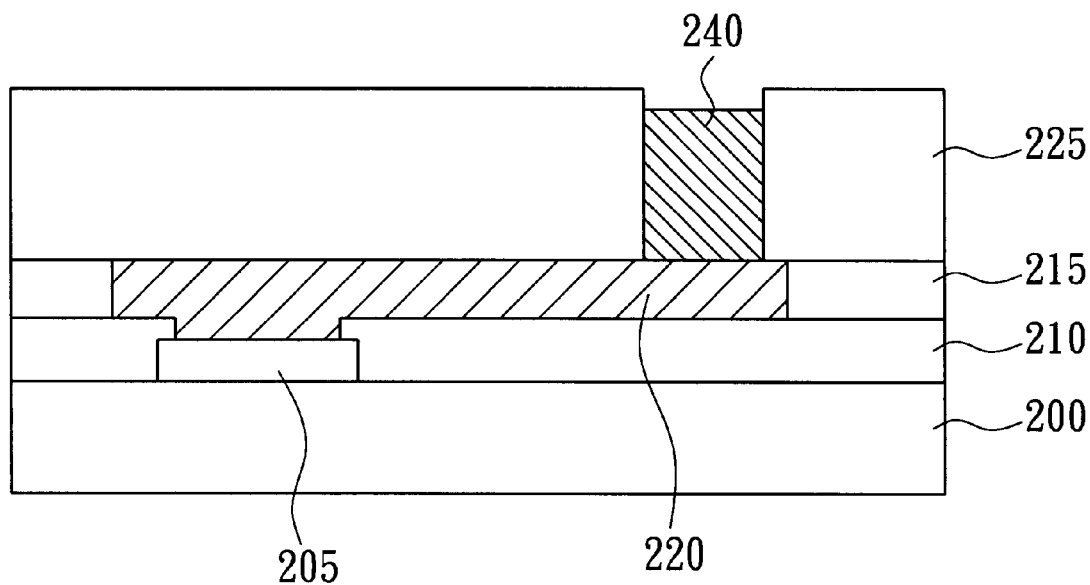

Step 6: As shown in FIG. 2F, initial metal bumps 240 of a pre-determined thickness on the pads 205 by electroless plating. It is preferable that the metal bumps 240 are formed of Ni, which has a much higher growth rate than Cu.

Figure 2G:
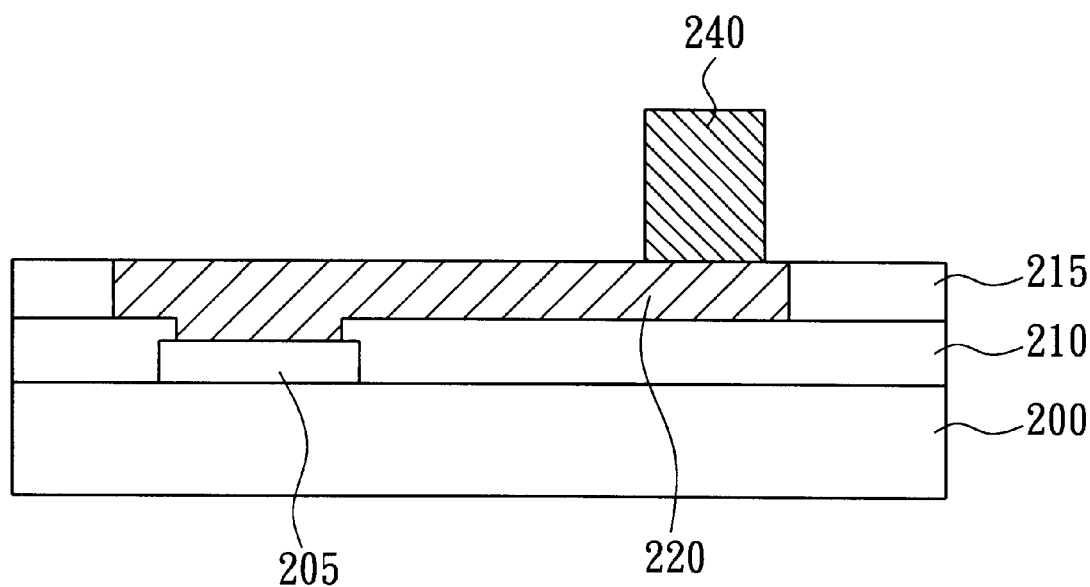

Step 7: The photoresist pattern 225 is removed so as to completely expose the metal bumps 240, as shown in FIG. 2G.

Figure 2H:
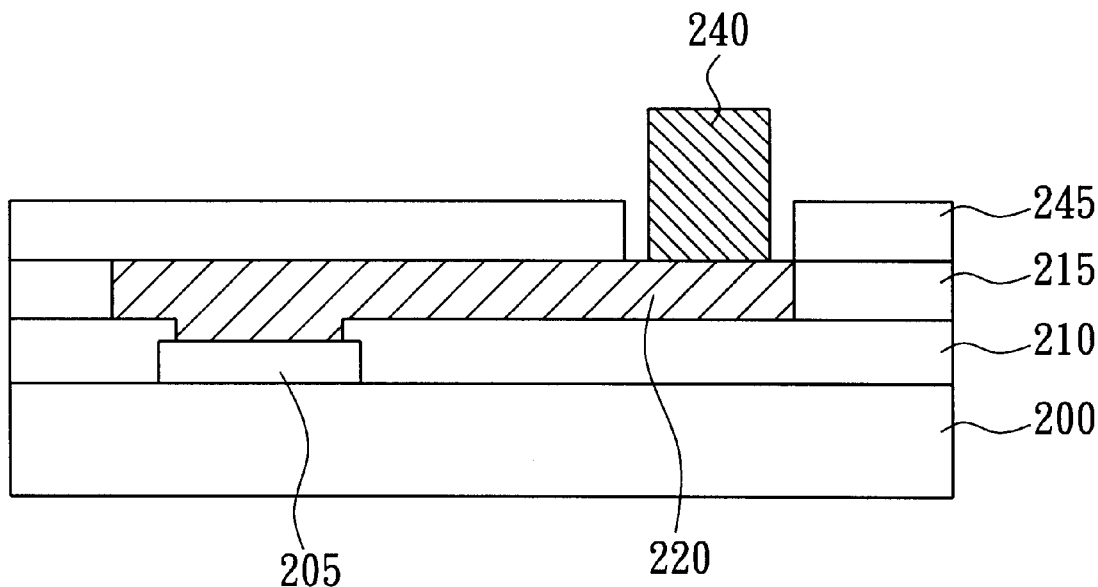

Step 8: As shown in FIG. 2H, a third dielectric layer 245 having a thickness less than the height of the metal bumps 240 and a window more than the size of the metal bumps 240 is dispensed so as to expose the metal bumps 240.

Figure 2I:
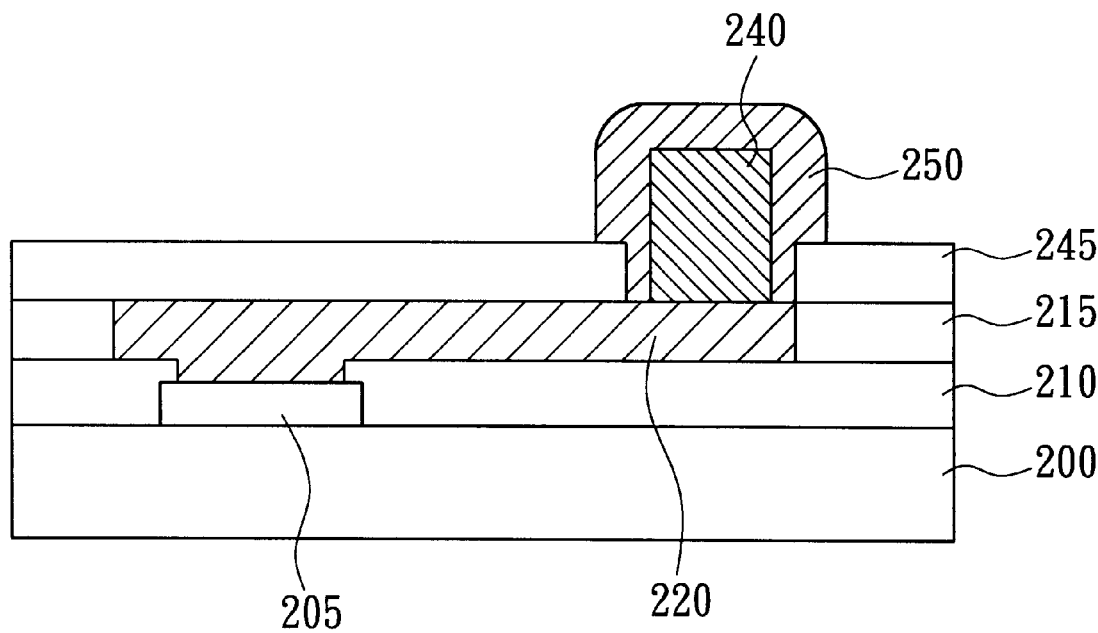

Step 9: Also of importance, a peripheral metal layer 250 is formed to cover the periphery of the metal bumps 240, as shown in FIG. 2I. It is preferable that the peripheral metal layer 240 is formed of Cu or Au. In this manner, a pad/Ni/Cu structure is formed. The thickness of the peripheral metal layer 250 is less than 4 $\mu$m.

Therefore, the pads 205 can be connected to the external circuit by using the conductive film 220 through the metal bumps 240. The positions of the pads 205 can be changed according to the layouts and the pads 205 are connected to the external circuit when electric testing is performed.

The utilized dielectric is preferably made of materials with better adhesion, and the dielectric layers can be formed by using chemical vapor deposition (CVD), sputtering, spin coating, and bonding.

As mentioned above, the present invention providing a fabricating process for forming Ni/Cu or Ni/Au bumps by electroless plating has at least the following advantages:

(1) When the conventional an-isotropic conductive film is used in LCD, IC, and RF device packages, the height of the metal bumps must be more than 20 $\mu$m. On the other hand, Cu bumps by electroless plating has a growth rate of 4 $\mu$m/hr, which can not provide good coverage. On the contrary, according to the present invention, Ni/Cu bumps by electroless plating can meet the requirements for good conductivity and excellent RF characteristics.

(2) According to skin effect, the current tends to concentrate near the surface layer of a RF device. The multi-layered bump of the present invention are composed of a rapidly grown Ni initial bump and a peripheral metal layer such as Cu or Au with good conductivity and RF characteristics by electroless plating, so as to be applicable to RF device package.

(3) The present invention simplifies the fabricating process for forming Ni/Cu bumps. Since the Ni/Cu bumps are fabricated by using batch production and the required facilities are not expensive, the present invention reduces the fabrication cost.

(4) The pads according to the present invention can be connected to the external circuit by using the conductive film through the metal bumps. The positions of the pads can be changed according to the layouts and the pads are connected to the external circuit when electric testing is performed.

As described above, the present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A fabricating process for forming multi-layered metal bumps by electroless plating, comprising the steps of:

(a) providing a semiconductor substrate on which there are provided a plurality of pads, wherein a passivation layer is deposited on the periphery of each of said pads, each of said pads is selected from a group consisting of a Cu pad and an Al pad;

(b) forming a photoresist pattern, exposing said pads;

(c) performing activation on said pads so as to generate an activator, said activator is a Zn seed for an Al pad;

(d) forming initial metal bumps of a pre-determined thickness on said pads by electroless plating;

(e) removing said photoresist pattern applied in step (b) so as to completely expose the initial metal bumps; and (f) forming a peripheral metal layer covering an exposed periphery of said exposed metal bumps.

2. The fabricating process for forming multi-layered metal bumps by electroless plating as recited in claim 1, wherein the thickness of said photoresist pattern is more than 15 $\mu$m.

3. The fabricating process for forming multi-layered metal bumps by electroless plating as recited in claim 1, wherein said step (b) further comprises a step (b1) of cleaning the surface of said pads.

4. The fabricating process for forming multi-layered metal bumps by electroless plating as recited in claim 1, wherein said initial metal bumps are formed of Ni with a thickness of 15~20 $\mu$m.

5. The fabricating process for forming multi-layered metal bumps by electroless plating as recited in claim 1, wherein said peripheral metal layer is formed of a material selected from the group consisting of Cu and Au.

6. The fabricating process for forming multi-layered metal bumps by electroless plating as recited in claim 1, wherein the total thickness of said initial metal bumps and said peripheral metal layer is at least 18 $\mu$m.

7. A fabricating process for forming multi-layered metal bumps by electroless plating, comprising the steps of:

(a) providing an IC chip on which there are provided a plurality of pads;

(b) dispensing a first dielectric layer, exposing said pads so as to define a redistribution path;

(c) roughing and activating the surface to be redistributed;

(d) depositing a conductive film on said redistribution path by electroless plating, in which said conductive film allows the positions of said pads to be changed so as to be connected to the external circuit;

(e) forming a photoresist pattern, exposing a plurality of pre-determined positions on said conductive film so as to redistribute the positions for said metal bumps formed later;

(f) performing activation on said pre-determined positions so as to generate an activator;

(g) forming initial metal bumps of a pre-determined thickness on said pads by electroless plating;

(h) removing said photoresist pattern applied in step (e), completely exposing said initial metal bumps;

(i) forming a second a second dielectric layer, having a thickness less than the predetermined thickness of said metal bumps and a window greater than a size of said initial metal bumps, so as to expose said initial metal bumps; and (j) forming a peripheral metal layer covering an exposed periphery of said initial metal bumps, in which the conductivity and the RF characteristics of said peripheral metal layer are better than those of said initial metal bumps so as to be electrically connected to said conductive film.

8. The fabricating process for forming multi-layered metal bumps by electroless plating as recited in claim 7, wherein a passivation layer is deposited on the periphery of each of said pads.

9. The fabricating process for forming multi-layered metal bumps by electroless plating as recited in claim 7, further comprising a step of dispensing a dielectric layer on the periphery of each of said pads between said step (c) and said step (d).

10. The fabricating process for forming multi-layered metal bumps by electroless plating as recited in claim 7, wherein each of said pad is selected from a group consisting of a Cu pad and an Al pad.

11. The fabricating process for forming multi-layered metal bumps by electroless plating as recited in claim 7, wherein said step (f) further comprises a step (f1) of cleaning the surfaces of said pads.

12. The fabricating process for forming multi-layered metal bumps by electroless plating as recited in claim 11, wherein said cleaning step is performed by using 10% $H_2SO_4$.

13. The fabricating process for forming multi-layered metal bumps by electroless plating as recited in claim 10, wherein said activator is a Zn seed for a Cu pad.

14. The fabricating process for forming multi-layered metal bumps by electroless plating as recited in claim 10, wherein said activator is a Zn seed for an Al pad.

15. The fabricating process for forming multi-layered metal bumps by electroless plating as recited in claim 7, wherein said initial metal bumps are formed of Ni with a thickness of at least 15 $\mu$m.

16. The fabricating process for forming multi-layered metal bumps by electroless plating as recited in claim 7, wherein said peripheral metal layer is formed of one of Cu and Au.

17. The fabricating process for forming multi-layered metal bumps by electroless plating as recited in claim 7, wherein the total thickness of said initial metal bumps and said peripheral metal layer is larger than the thickness of said second dielectric layer by at least 18 $\mu$m.

\* \* \* \* \*